(12) United States Patent
Kernebeck et al.

(10) Patent No.: US 10,008,349 B2
(45) Date of Patent: Jun. 26, 2018

(54) SWITCHING DEVICE AND METHOD FOR DETECTING WHETHER SAID SWITCHING DEVICE IS BEING ACTUATED

(71) Applicant: ZF Friedrichshafen AG, Friedrichshafen (DE)

(72) Inventors: Bernd Kernebeck, Bad Essen (DE); Hans-Werner Nanz, Mühlacker (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 0 days. days.

(21) Appl. No.: 15/324,834

(22) PCT Filed: Jun. 9, 2015

(86) PCT No.: PCT/EP2015/062789
§ 371 (c)(1),
(2) Date: Jan. 9, 2017

(87) PCT Pub. No.: WO2016/005124
PCT Pub. Date: Jan. 14, 2016

(65) Prior Publication Data
US 2017/0221661 A1      Aug. 3, 2017

(30) Foreign Application Priority Data
Jul. 10, 2014   (DE) .................. 10 2014 213 396

(51) Int. Cl.
*H01H 9/00*   (2006.01)
*H01H 36/02*   (2006.01)

(52) U.S. Cl.
CPC ......... *H01H 36/02* (2013.01); *H01H 2215/03* (2013.01); *H01H 2215/034* (2013.01); *H01H 2231/026* (2013.01)

(58) Field of Classification Search
CPC ...................................................... H03K 17/97
(Continued)

(56) References Cited

U.S. PATENT DOCUMENTS 4,639,668 A  *  1/1987  Petit ................... B25J 13/02
                                                    200/6 A
4,733,214 A  *  3/1988  Andresen ............... G05G 5/06
                                                    324/207.24
(Continued)

FOREIGN PATENT DOCUMENTS

DE          4328427 A1       3/1995
DE      102012209366 A1     12/2013

OTHER PUBLICATIONS

International Search Report and Written Opinion dated Dec. 17, 2015 for PCT/EP2015/062789 (German language, 13 pages).
(Continued)

*Primary Examiner* — Alexander Talpalatski
(74) *Attorney, Agent, or Firm* — Brinks Gilson & Lione

(57) ABSTRACT

A switch device is presented. The switch device comprises a magnet supported such that it can be tilted, a transmitter device coupled to the magnet, designed to cause a tilting movement of the magnet in response to a switch actuation of the switch device, and a sensor device, having a first sensor element and a second sensor element for detecting the tilting movement, wherein the first sensor element is designed to acquire a plurality of first magnetic field values of a magnetic field shift of a magnetic field generated by the magnet caused by the tilting movement, and the second sensor element is designed to acquire a plurality of second magnetic field values of a second magnetic field shift of the magnetic field generated by the magnet caused by the tilting movement.

16 Claims, 3 Drawing Sheets

(58) Field of Classification Search
USPC .................................................. 335/205–207
See application file for complete search history.

(56) References Cited

U.S. PATENT DOCUMENTS

| | | | | |
|---|---|---|---|---|
| 4,788,534 A * | 11/1988 | Engelhardt | ............... | G01P 1/10 |
| | | | | 200/81.9 M |
| 4,825,157 A * | 4/1989 | Mikan | ................... | G01B 7/004 |
| | | | | 200/6 A |
| 5,160,918 A * | 11/1992 | Saposnik | ............... | G05G 9/047 |
| | | | | 273/148 B |
| 5,646,587 A * | 7/1997 | Miyazawa | ............. | H03K 17/97 |
| | | | | 335/205 |
| 6,031,439 A * | 2/2000 | Adams | .................... | A61B 8/12 |
| | | | | 335/205 |
| 6,380,733 B1 * | 4/2002 | Apel | ..................... | B60K 37/06 |
| | | | | 324/207.2 |
| 6,486,764 B2 * | 11/2002 | Byram | ................... | G01D 5/145 |
| | | | | 324/207.25 |
| 6,515,650 B2 * | 2/2003 | Arita | ..................... | G05G 9/047 |
| | | | | 345/156 |
| 6,606,085 B1 * | 8/2003 | Endo | ................... | G05G 9/04796 |
| | | | | 345/159 |
| 6,738,043 B2 * | 5/2004 | Endo | .................... | G06F 3/0338 |
| | | | | 324/207.13 |
| 6,760,006 B2 * | 7/2004 | Arita | ..................... | G05G 9/047 |
| | | | | 345/156 |
| 7,382,120 B2 * | 6/2008 | Narasimhan | ........... | G01D 5/145 |
| | | | | 324/207.2 |
| 7,504,598 B2 * | 3/2009 | Weigold | ................. | H03K 17/97 |
| | | | | 200/61.45 M |
| 8,022,796 B2 * | 9/2011 | Deininger | ............... | B60R 25/04 |
| | | | | 307/10.3 |
| 8,284,003 B2 * | 10/2012 | Klossek | ................... | G05G 5/05 |
| | | | | 335/205 |
| 2008/0088397 A1 * | 4/2008 | Kretschmer | ........... | G05G 9/047 |
| | | | | 335/205 |

OTHER PUBLICATIONS

International Search Report dated Dec. 17, 2015 for PCT/EP2015/062789 (English language, 2 pages).

* cited by examiner

SWITCHING DEVICE AND METHOD FOR DETECTING WHETHER SAID SWITCHING DEVICE IS BEING ACTUATED

RELATED APPLICATIONS

This application is a filing under 35 U.S.C. § 371 of International Patent Application PCT/EP2015/062789, filed Jun. 9, 2015, and claims the benefit and priority of German Patent Application DE 10 2014 213 396.3, filed Jul. 10, 2014, both of which are incorporated by reference herein in their entirety.

BACKGROUND

1. Technical Field

The present invention relates to a switch device and a method for detecting an actuation of a switch device.

2. Background Information

Many pushbutton switches, used for example on the instrument panels in vehicles, are equipped with analog sensors for detecting positions. An exemplary pushbutton switch from the prior art has four buttons, each of which has a separate sensor system comprised of a magnet and an analog sensor. When a button is actuated, the magnet is moved closer to the sensor, wherein the magnetic field in the sensor becomes stronger. An un-actuated button acts on the sensor with a weak magnetic field.

DE 86 08 400 U1 discloses an electric switch having two spring supported switch buttons on a switch housing, each of which can be pushed via a tappet on a rocker arm of a rocker switch of a switch guard.

BRIEF SUMMARY

Based on this background, the present invention creates an improved switch device and an improved method for detecting an actuation of a switch device according to the independent claims. Advantageous designs can be derived from the dependent claims and the following description.

A switch device presented herein comprises, in addition to a magnet that can be tilted, and a transmitter device coupled to the magnet, for executing a tilting movement of the magnet, a sensor device having two sensor elements for detecting the tilting movement.

With the redundant sensor system of the proposed switch device, errors in the position detection, and thus misdiagnoses caused by external magnetic disturbance fields, can be prevented. It is possible to eliminate an additional detection unit for each transmitter unit and still achieve the safety goals through the use of the redundant sensor system.

A switch device comprises the following features: a magnet supported such that it can tilt; a transmitter device coupled to the magnet, which is designed to cause a tilting movement of the magnet in response to a switching actuation of the switch device; and a sensor device having a first sensor element and a second sensor element for sensing a tilting movement, wherein the first sensor element is designed to acquire a plurality of first magnetic field values of a first magnetic field shift of a magnetic field generated by the magnet, caused by the tilting movement, and the second sensor element is designed to acquire a plurality of second magnetic field values of a second magnetic field shift of the magnetic field generated by the magnet, caused by the tilting movement.

The switch device can be integrated, for example, in an instrument panel for use in a vehicle. The switch device can be designed as a button or a switch. The magnet can be a bar magnet, for example, which can be supported such that it can be tilted or rotated about an axis passing through its center. The magnet can be designed as a permanent magnet, having a permanent north pole section and a permanent south pole section. The transmitter device can be designed to transfer the switching actuation of an operator of the switch device to the magnets by means of appropriate transmitter elements, such that the tilting movement can be executed. The tilting movement can occur starting from a standby position of the magnet, in which the magnet can be located in a horizontal position in relation to the first and second sensor elements. The switch actuation can comprise a pressing of a switch surface of the switch device by an actuator of the switch device, e.g., a driver of the vehicle. The entire magnetic field of the magnet can be shifted by the tilting movement. The first magnetic field shift can relate to a shift of a first section of the magnetic field, and the second magnetic field shift can relate to a second section of the magnetic field. The first and second magnetic field shifts can thus be attributed to a rotation of the magnetic field generated by the magnet based on the tilting movement. The first and second sensor elements can be disposed thereby in relation to the magnet, such that, based on the tilting movement, a section of the magnetic field is moved toward one of the sensor elements, while at the same time, another section of the magnetic field is moved away from the other sensor element. Accordingly, the first and second sensor elements can each detect magnetic field values changing at the same rates, but in opposite directions.

Known sensors, which are designed to detect a magnetic field or a change in a magnetic field, can be used for the sensor elements. In accordance with one embodiment of the switch device, the two sensor elements, or one of the sensor elements of the sensor device, can be a Hall sensor. As a result, the magnetic field values can be reliably acquired at each position of the magnet.

The first sensor element can be assigned to the magnetic north pole section of the magnet. Accordingly, the second sensor element can be assigned to the magnetic south pole section of the magnet. By way of example, the first sensor element can be positioned on a side of the switch device assigned to the north pole section, in relation to an imaginary separating plane between the magnetic north pole section and the magnetic south pole section of the magnet, and the second sensor element can be positioned on a side assigned to the south pole section.

In accordance with another embodiment, the switch device can have an evaluation device coupled to the sensor device. The evaluation device can be designed to provide an actuation signal for indicating the switch actuation when one of the plurality of first magnetic field values corresponds to a predetermined first actuation value, and additionally or alternatively, one of the plurality of second magnetic field values corresponds to a predetermined second actuation value. The evaluation device can be disposed directly on or in the senor device thereby, or it can be connected to the sensor device via wires. The predetermined actuation values can be established during the production of the switch device, and stored in the evaluation device.

Alternatively, the predetermined actuation values can be acquired through an actuation of the switch device. The actuation values can correspond, for example, to a predetermined degree of tilting of the magnet. In order to determine the actuation signal, the evaluation device can be designed employ a comparison of the first magnetic field value with the predetermined first actuation value, and a comparison of the second magnetic field value with the predetermined second actuation value, using an appropriate algorithm. By way of example, the actuation signal can be provided as soon as one of the first magnetic field values is close enough to the predetermined first actuation value, and one of the second magnetic field values is close enough to the predetermined second actuation value. In this manner, the actuation signal can be carried out using a threshold value comparison, wherein the threshold or thresholds of the comparison can be defined by the actuation value or values. The expansion of the switch device to include the evaluation device can contribute to a quick and reliable provision of the actuation signal.

In particular, the switch device can have a mechanical element, which can be designed to indicate, haptically and/or acoustically, a switching actuation of the transmitter device sufficient for providing the actuation signal. As a result, an actuator of the switch device receives feedback regarding a successful actuation of the switch device, and does not need a visual confirmation of the successful actuation. In particular with the use of the switch device in a vehicle, this embodiment is of great advantage with respect to safety aspects while driving.

A characteristic change in the course of the tilting movement of the magnet can be caused by means of the mechanical element. The characteristic change in course can lead to a characteristic curve of the magnetic field values, and it can thus be detected through an evaluation of the magnetic field values.

The mechanical element can comprise at least one snap disk. A snap disk of this type can be integrated, for example, in the switch device, coupled to the transmitter device. The use of a snap disk is cost efficient. Furthermore, a snap disk is a very robust element, which will never need to be replaced over the course of the lifetime of the switch device.

Furthermore, the evaluation device can be designed to determine a curve of the first magnetic field values based on the plurality of first magnetic field values, to detect a first current magnetic field value of the plurality of first magnetic field values when the curve exhibits a predetermined characteristic, and to modify the predetermined first actuation value to the first current magnetic field value. Accordingly, the evaluation device can be designed to determine a curve of the second magnetic field values, based on the plurality of second magnetic field values, to detect a second current magnetic field value of the plurality of second magnetic field values, and to modify the predetermined second actuation value to the second current magnetic field value. A rate of change of the magnetic field values can also be recorded as the curve of the magnetic field values. Accordingly, the corresponding current magnetic field value can be detected when the curve of the rate of change exhibits a predetermined characteristic. Thus, a switching point of the switch device represented by the actuation values can be adjusted without difficulty to changes in a mechanical interaction of the switch device elements due to aging, for example, and shifted accordingly. A feedback referred to as "switching feel" to the actuator regarding a switching occurring correctly can thus be maintained over an entire lifetime of the switch device.

In particular, the evaluation device can be designed to modify the predetermined first actuation value to the first current magnetic field value, when the first current magnetic field value lies within a predetermined first magnetic field value interval for the plurality of first magnetic field values. Accordingly, the evaluation device can be designed to modify the predetermined second actuation value to the second current magnetic field value, when the second current magnetic field value lies within a predetermined second magnetic field value interval for the plurality of second magnetic field values. Thus, it can be ensured in a simple and inexpensive manner, that unrealistic magnetic field values will not lead to a change in the switching point.

In accordance with another embodiment, the transmitter device can furthermore be designed to cause a further tilting movement of the magnet in the opposite direction of the initial tilting movement, in response to a further switch actuation of the switch device. In order to detect the further tilting movement, the first sensor element can furthermore be designed, accordingly, to acquire a plurality of further first magnetic field values, e.g., complementary to the first magnetic field values, of a further first magnetic field shift of the magnetic field generated by the magnet caused by the further tilting movement. Likewise, the second sensor element can furthermore be designed to acquire a plurality of further second magnetic field values, e.g., complementary to the second magnetic field values, of a further second magnetic field shift of the magnetic field generated by the magnet, caused by the further tilting movement. In this embodiment, the switch device can be used as a rocker switch having two distinct switching positions. It is advantageous thereby that a current functionality of the switch device can be clearly identified at a glance. Misperceptions, pertaining to whether a device that is to be switched on and off with the switch device is currently being operated or not, can basically be eliminated.

In a special embodiment, the switch device can have a disk supporting the magnet, as well as an axle passing through the disk, for supporting the magnet such that it can be tilted. Furthermore, the transmitter device can have a first transmitter element and a second transmitter element. The first transmitter element can be coupled to the disk at a first position, and can be designed to cause the tilting movement. The second transmitter element can be coupled to the disk at a second position, and can be designed to cause the further tilting movement. In this embodiment, the switch device can be produced inexpensively, and such that it requires little maintenance and can be used universally.

A method for detecting an actuation of a switch device, comprising a magnet that is supported such that it can be tilted, a transmitter device coupled to the magnet, which is designed to cause a tilting movement of the magnet in response to a switching actuation of the switch device, and a sensor device, which comprises a first sensor element and a second sensor element for detecting the tilting movement, wherein the first sensor element is designed to acquire a plurality of first magnetic field values of a first magnetic field shift of a magnetic field generated by the magnet, caused by the tilting movement, and the second sensor element is designed to acquire a plurality of second magnetic field values of a second magnetic field shift of the magnetic field generated by the magnet, caused by the tilting movement, includes the following step: provision of an actuation signal for indicating the switching actuation when a magnetic field value of the plurality of first magnetic field values corresponds to a predetermined first actuation value, and a magnetic field value of the plurality of second magnetic field values corresponds to a predetermined second actuation value.

Advantageously, on and off switching procedures that eliminate disruptive factors and are highly functional can be effected with a switch device that executes the method. The method can be executed, for example, using an evaluation device of the type described above. The evaluation device can be an electric device, which processes electric signals, e.g., sensor signals, and outputs control signals on the basis thereof. The evaluation device can have one or more suitable interfaces, which can be designed as hardware and/or software. With a hardware design, the interface can be part of an integrated circuit, for example, in which functions of the evaluation device are implemented. The interfaces can also be independent, integrated circuits, or comprise at least partially discrete components. With a software design, the interfaces can be software modules, which are present, for example, on a microcontroller, in addition to other software modules.

In accordance with one embodiment, the method furthermore has a step for determining a curve of the first magnetic field values, and a curve of the second magnetic field values, a step for acquiring a first current magnetic field value of the plurality of first magnetic field values, when the curve exhibits a predetermined characteristic, and a second current magnetic field value of the plurality of second magnetic field values, when the curve exhibits a predetermined characteristic, and a step for modifying the predetermined first actuation value to the first current magnetic field value, and the predetermined second actuation value to the second current magnetic field value.

Thus, in a simple manner, a switching point for a switch device executing the method can be adapted to mechanical changes within the switch device, such that the switch device offers an actuator a positive "switching feeling" for successfully effected switch actuations over the entire lifetime of the switch device.

A computer program product containing program code, which can be stored on a machine readable medium, such as a semiconductor memory, a hard disk memory, or an optical memory, and is used for executing the method according to one of the embodiments described above, is also advantageous, when the program is executed on a computer or a device.

BRIEF DESCRIPTION OF THE DRAWINGS

The invention shall be explained in greater detail, in an exemplary manner, based on the attached drawings. Therein.

DETAILED DESCRIPTION OF THE DRAWINGS AND THE PRESENTLY PREFERRED EMBODIMENTS

In the following description of preferred exemplary embodiments of the present invention, the same or similar reference symbols are used for the elements depicted in the various figures having similar functions, wherein there shall be no repetition of a description of these elements.

Figure 1:
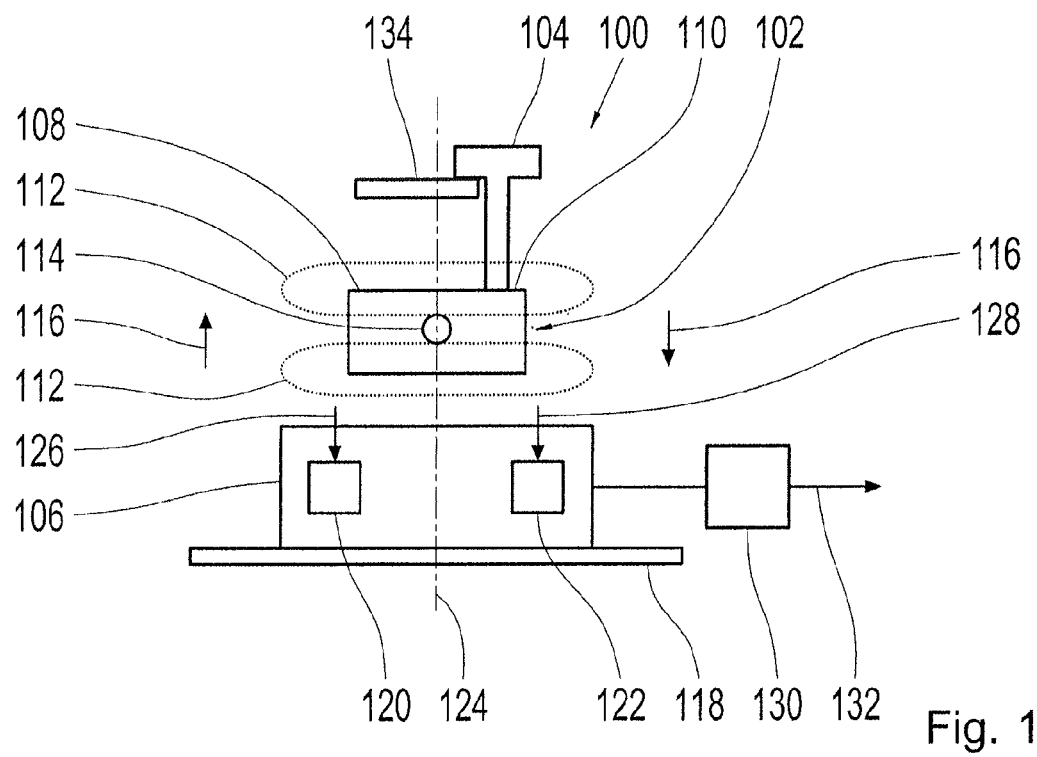
FIG. 1 shows a block diagram of a switch device in accordance with an exemplary embodiment of the present invention.

FIG. 1 shows a block diagram of a switch device 100 in accordance with an exemplary embodiment of the present invention. The exemplary switch device 100 can be integrated in an instrument panel of a vehicle, such as a passenger automobile or a truck, or it can be positioned at other locations within the vehicle. By way of example, comfort and safety functions of the vehicle, such as headlamps, electric windows, the air conditioner, etc., can be controlled or regulated by the driver or a passenger in the vehicle, with finger pressure applied to a switch surface of the switch device 100. The switch device 100 can be designed as a switch or a button.

In the exemplary embodiment shown in FIG. 1, the switch device 100 has a magnet 102, a transmitter device 104 and a sensor device 106. The magnet 102 is a permanent magnet, in the shape of a bar here. A first half—on the left side in the illustration—of the magnet 102 forms a north pole section 108 of the magnet, and a second half—on the right side in the illustration—of the magnet 102 forms a south pole section 110 of the magnet. The permanent magnet 102 generates a magnetic field 112, which is indicated in the illustration in FIG. 1 by means of a characteristic curve of the magnetic field lines. The magnet is supported such that it can be tilted or rotated via an axle 114 inserted, for example, through a hole in the center of the magnet 102. The transmitter device 104 is coupled, or can be coupled, directly or indirectly, to the magnet 102 via a transmitter element, and is designed to cause a tilting movement 116 of the magnet 102 about the axle 114, indicated here by means of arrows, in response to an actuation by an actuator. The transmitter device 104 can be connected to an actuation element of the switch device in one or two pieces. Thus, an actuator can bring the magnet 102 into a tilted position via the transmitter device 104 through pressing on a switch surface of the actuation element, and thus trigger a desired switching procedure of the switch device.

In the exemplary embodiment of the switch device shown in FIG. 1, the sensor device 106 is disposed beneath the magnet 102 on a printed circuit board 118 or, alternatively, on another arbitrary carrier element of the switch device 100. The sensor device 106 is designed to detect the tilting movement 116 of the magnet 102, and for this, it comprises a first sensor element 120 and a second sensor element 122. The first sensor element 120 is assigned thereby to the north pole section 108 of the magnet 102, and the second sensor element 122 is assigned to the south pole section 110 of the magnet 102. In the exemplary embodiment of the switch device 100 shown in FIG. 1, these assignments are given in that the first sensor element 120 is positioned diagonally beneath the north pole section 108 in relation to an imaginary axis of symmetry 124 through a center of the magnet 102 (indicated by a vertical broken line in the illustration in FIG. 1) on the side containing the north pole section 108, and the second sensor element 122, is positioned diagonally beneath the south pole section 110, in relation to the imaginary axis of symmetry 124 on the side containing the south pole section 108. These assignments are exemplary. In accordance with alternative exemplary embodiments, the assignments can be implemented in general, such that in principle, the one specific section of the sensor element assigned to the magnet 102 is positioned closer to this section than the other in each case. With the exemplary switch device 100 shown in FIG. 1, the sensors, or sensor elements 120, 122 are designed as Hall sensors. Alternatively, other suitable measurement pick-ups can also be used.

In the exemplary embodiment of the switch device 100 shown in FIG. 1, the transmitter device 104 is positioned in relation to the magnet 102 such that a switch actuation executed via the transmitter device 104 causes the tilting movement 116 in the form of a downward tilting of the south pole section 110 of the magnet 102 and a simultaneous upward tilting of the north pole section 108. In the tilting movement 116, the south pole section 110 approaches the second sensor 122, while the north pole section 108 moves away from the first sensor 120. Accordingly, the magnetic field 112 generated by the magnet 102 is shifted, thus approaching the second sensor 122, at the right in the illustration, and moving away from the first sensor 120, at the left in the illustration.

With the exemplary embodiment of the device 100 shown in FIG. 1, the first sensor element 120 is designed to acquire a plurality of first magnetic field values 126 of a first magnetic field shift of the magnetic field 112 of the magnet 102 caused by the tilting movement 116. The second sensor element 122 is designed accordingly to acquire a plurality of second magnetic field values 128 of a second magnetic field shift of the magnetic field 112 of the magnet 102 caused by the tilting movement 116. Based on the spacing of the magnetic field range at the north pole of the magnet 102 from the first sensor 120 and the proximity of the magnetic field range at the south pole of the magnet 102 to the second sensor 122, the first magnetic field values 126 are always precisely opposed in terms of their signs, in accordance with this exemplary embodiment, i.e., if the first magnetic field values 126 increase, then the second magnetic field values 128 decrease, and vice versa.

The exemplary switch device 100 in FIG. 1 furthermore has an evaluation device 130. The evaluation device 130 is coupled to the sensor device 106, and is designed to process the acquired magnetic field values 126 using an appropriate algorithm, and to provide an actuation signal 132 to indicate a switch actuation when a magnetic field value of the plurality of first magnetic field values 126 corresponds to a predetermined first actuation value, and corresponds to a magnetic field value of the plurality of second magnetic field values 128 of a predetermined second actuation value. The first and second actuation values represent a switching point of the switch device 100 here. The switch device 100 executes a switching procedure initiated through the actuation of the transmitter device 104 at the switching point, i.e., it provides the actuation signal 132 appropriate for switching a device coupled to the switch device 100 on or off.

As a further special feature, the exemplary embodiment of the switch device 100 shown in FIG. 1 has an optional mechanical element 134. In the exemplary switch device 100, the mechanical element 134 is designed as a snap disk and is, or can be, coupled to the transmitter device 104. The snap disk 134 is disposed in or on the switch device 100 such that when the transmitter device 104 is sufficiently actuated for switching, a tilting movement 116 is caused—thus with a sufficiently long and/or strong pressing of the actuation element of the switch device 100 by an actuator—such that it jumps from a stable state to a metastable state, and then back to the stable state. A curve of the tilting movement 116 can be shaped by means of the snap disk 134, such that the tilting movement 116 is first braked, and then strongly accelerated as a result of a snapping of the snap disk 134. Thus, the snapping of the snap disk 134 leads to a characteristic change in the curve of the tilting movement 116. The snap disk 134 is disposed and designed such that the snapping of the snap disk 134 occurs in the period of the switching point of the switch device 100, and is thus appropriate for indicating the provision of the actuation signal 132 haptically and/or acoustically, and to thus provide the actuator with information regarding a successful actuation of the switch device 100. The mechanical element 134 can also be implemented in forms other than a snap disk 134, and can be installed at different positions in the switch device 100. In accordance with exemplary embodiments, numerous mechanical elements 134 may be made use of in the switch device 100.

Figure 2:
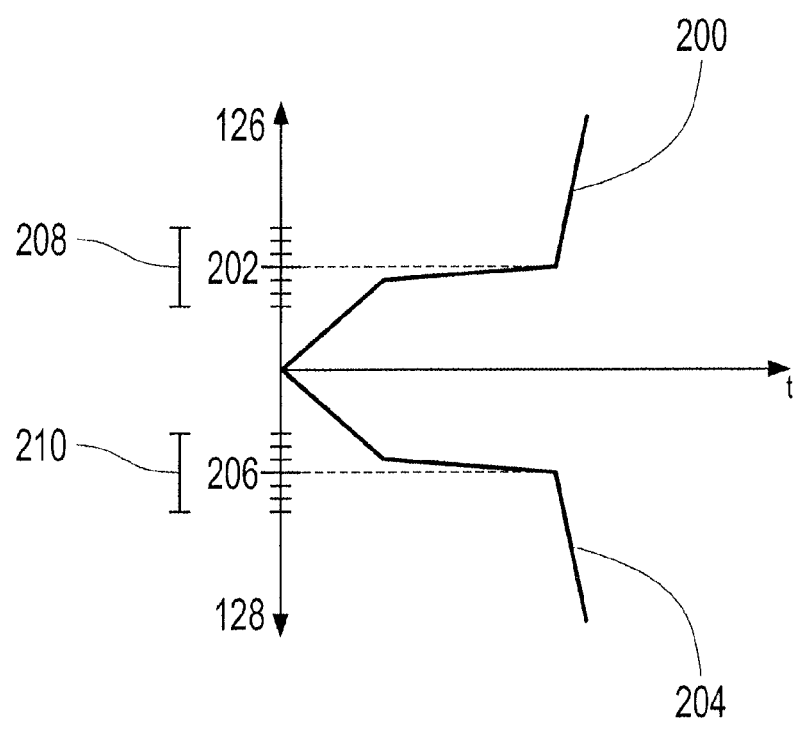
FIG. 2 shows a diagram illustrating the acquisition of a defined switching point for the switch device, in accordance with an exemplary embodiment of the present invention.

FIG. 2 shows a diagram explaining an acquisition of a defined switching point of the switch device according to an exemplary embodiment of the present invention. A schematically depicted curve 200 of first magnetic field values 126 and a schematically depicted curve 204 of second magnetic field values 126 occurring with an actuation of a switch device are plotted as a function of time t in a Cartesian coordinate system. The switch device is equipped thereby with a mechanical element, explained in reference to FIG. 1, for a haptic and/or acoustic indication of a switching actuation of the switch device. The first magnetic field values 126 can be acquired and provided, for example, by the first sensor element shown in FIG. 1. Accordingly, the second magnetic field values 128 can be acquired and provided by the second sensor element shown in FIG. 1.

The curve 200 of the first magnetic field values 126 first exhibits an initial increase when the transmitter device of the switch device is actuated, such that an initial rate of change between successive first magnetic field values 126 is obtained. With further actuation, a resistance of the incorporated mechanical element to a pressure exerted by the actuator on the transmitter device increases, and the curve 200 of the first magnetic field values 126 levels off, whereby the rate of change between successive first magnetic field values 126 also decreases in relation to the first rate of change. When the mechanical element is overcome due to further actuation, the resistance is overcome, and the curve 200 exhibits a third increase, which is greater than the first increase. As a result, a third rate of change between successive first magnetic field values 126 occurs, which is greater than the first rate of change. A bend between the flat and steep sections of the curve 200 depicts a predefined characteristic in the curve 200, or a predefined characteristic in the rate of change between successive first magnetic field values 126, which is a sequence of a characteristic change in the curve of the tilting movement of the magnet caused by the mechanical element. When the predefined characteristic is detected, a current magnetic field value, which lies, for example, directly prior to the bend, on the bend, or following the bend, can be detected as the first current magnetic field value 202 of the plurality of first magnetic field values 126, and it can be used to acquire a defined switching point of the switch device. For this, an evaluation device or an appropriate control device of the switch device can set the predefined first actuation value to the first current magnetic field value 202.

The curve 204 of the second magnetic field values 128 corresponds, in terms of its values to the curve 200 of the first magnetic field values 126, but with an inverse sign. The curve 204 has a corresponding bend, at which a second current magnetic field value 206 of the plurality of magnetic field values 128 is acquired, and can be used to acquire a defined switching point of the switch device. For this, the evaluation device, or the appropriate control device of the switch device can set the second actuation value to the second current magnetic field value 206.

According to exemplary embodiments, an evaluation device or a control device of an exemplary switch device presented herein can be designed to modify the predefined first actuation value to the first current magnetic field value 202, when the first current magnetic field value 202 lies within a predefined first magnetic field value interval 208. Accordingly, the evaluation device, or the control device, can be designed to modify the predefined second actuation value to the second current magnetic field value 206, when the second current magnetic field value 206 lies within a predefined second magnetic field value interval 210. The functionality for acquiring the switching point presented on the basis of the diagram in FIG. 2 can also be implemented without using a mechanical element, or by using a mechanical element differing from the mechanical element described in reference to FIG. 1, in order to compensate for a mechanical interaction that changes as the switch device ages.

Figure 3:
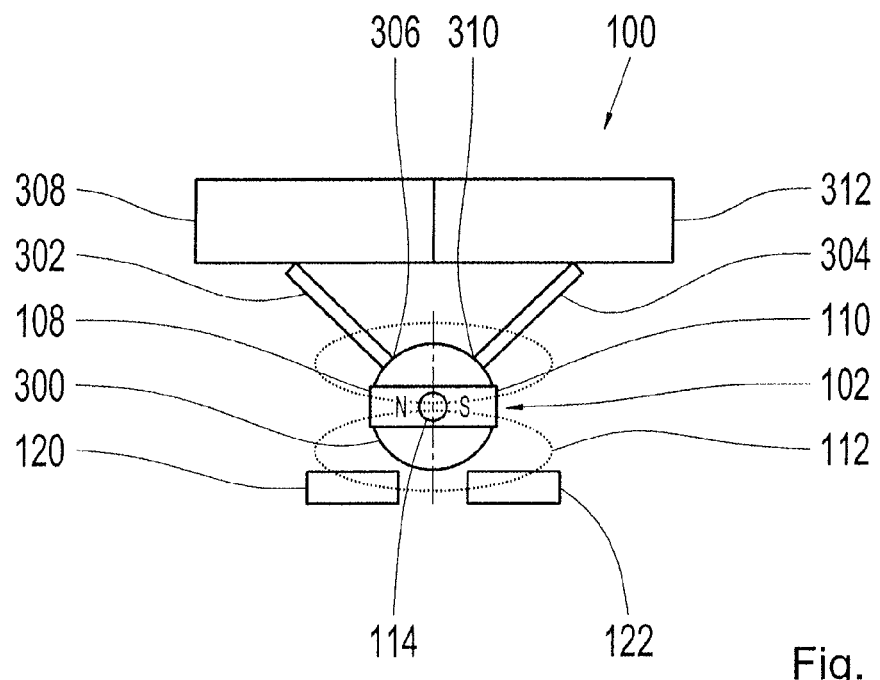
FIG. 3 shows a schematic diagram of a switch device in accordance with another exemplary embodiment of the present invention, in a standby position.

FIG. 3 shows a schematic diagram of the switch device 100 according to another exemplary embodiment of the present invention. The magnet 102 is again designed as a bar magnet having a north pole section 108 and a south pole section 110. In the exemplary embodiment of the switch device 100 shown in FIG. 3, the magnet 102 is supported on a disk 300, the diameter of which corresponds basically to the length of the magnet 102. The axle 114 for the tilting support of the magnet 102 passes through both the magnet 102 as well as the disk 300 supporting the magnet, in the center thereof. As with the exemplary embodiment shown in FIG. 1, the first sensor element 120 is also disposed here diagonally beneath the north pole section 108, and assigned thereto, and the second sensor element 122 is disposed diagonally beneath the south pole section 110, and assigned thereto.

Contrary to the exemplary embodiment shown in FIG. 1, the transmitter device of the exemplary switch device 100 shown in FIG. 3 has a transmitter device comprising a first transmitter element 302 and a second transmitter element 304. This design of the transmitter device 304 makes it possible to design the switch device 100 as a switch having two stable or to unstable switching settings. As is shown in the illustration, the transmitter elements 302, 304 are each designed as bars. The first transmitter element 302 extends from a first position 306 on the disk 300, close to the north pole section 108 of the magnet 102, to a first actuation element 308 of the switch device 100. The second transmitter element 304 extends from a second position 310 on the disk 300, close to the north pole section of the magnet 102, to a second actuation element 312 of the switch device 100.

The illustration in FIG. 3 shows the exemplary switch device 100 in a standby position. The bar magnet 102 is parallel to the sensor elements 120, 122. A spacing of the north pole section 108 to the first sensor element 120 is equal to the spacing of the south pole section 110 to the second sensor element 122. Accordingly, the sensors 120, 122 acquire equal first and second magnetic field values in terms of their amounts.

Figure 4:
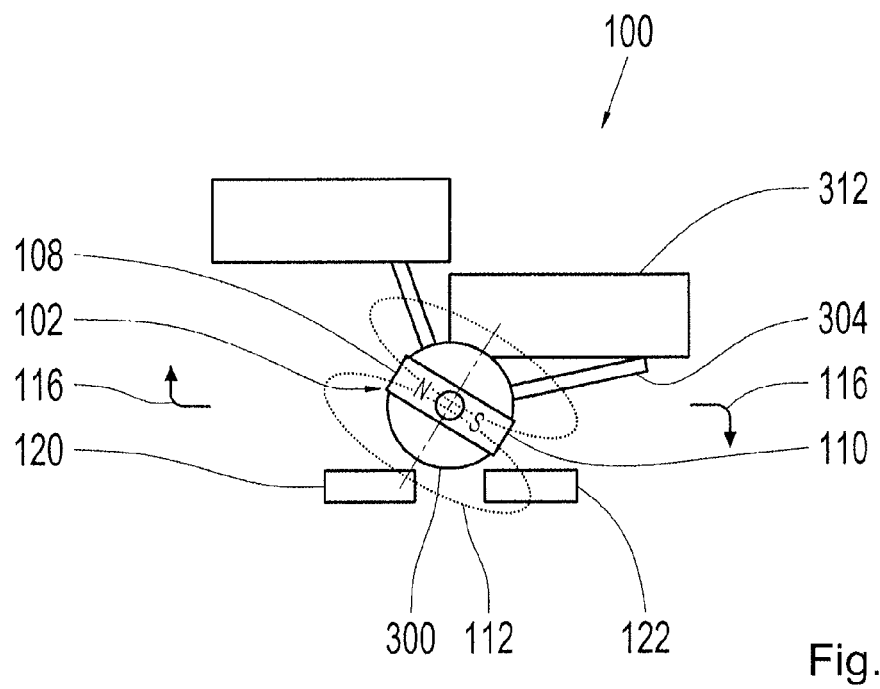
FIG. 4 shows a schematic diagram of the switch device from FIG. 3, following a tilting movement of the magnet, in accordance with an exemplary embodiment of the present invention.

FIG. 4 shows the exemplary switch device 100 from FIG. 3, based on another schematic diagram, in a first tilted position. The illustration in FIG. 4 shows the switch device 100 after a switching actuation of the second actuation element 312. In response to the switching actuation, the second transmitter element 304 has caused the tilting movement 116 already described in reference to the illustration in FIG. 1, through a turning of the disk 300. In the first tilted position shown in FIG. 4, the south pole section 110 of the magnet 102 is now closer to the second sensor element 122 than in the standby position of the switch device 100 shown in FIG. 3. The north pole section 108 of the magnet 102, on the contrary, is now further away from the first sensor element 120 than in the standby position of the switch device 100 shown in FIG. 3. A shift in the magnetic field 112 caused by the magnet 102 occurs with the tilting movement 116. Thus, in the detection of the tilting movement 116, the first sensor 120 detects a plurality of changing first magnetic field values, and the second sensor 122 detects a plurality of changing second magnetic field values that are complementary to the first magnetic field values.

Figure 5:
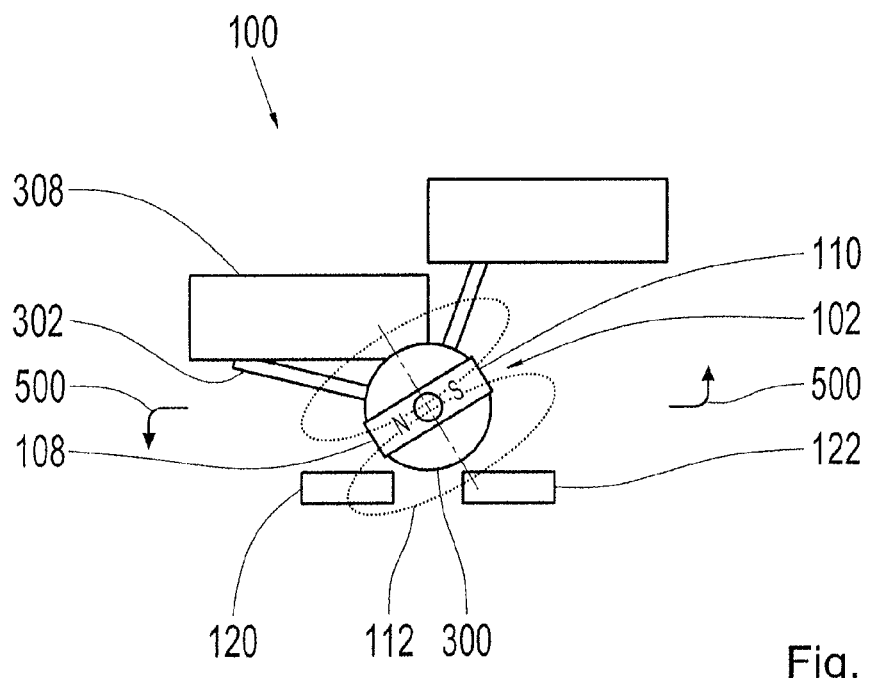
FIG. 5 shows a schematic diagram of the switch device from FIG. 3, following a further tilting movement of the magnet, in accordance with an exemplary embodiment of the present invention.

FIG. 5 shows, in turn, in a schematic diagram, the exemplary switch device 100 from FIG. 3 in a second tilted position, resulting from a further switching actuation of the transmitter device. As a result of the further switching actuation, an actuator presses on the first actuation element 308. Accordingly, the first transmitter element 302 causes a further tilting movement 500 of the magnet 102, counter to the first tilting movement, through a further rotation of the disk 300, counter to the first turning. As a result of the further tilting movement 500, the magnet is moved from the first tilted position shown in FIG. 4, into the second stable tilted position shown in FIG. 5, via the standby position shown in FIG. 3.

In the second tilted position shown in FIG. 5, the south pole section 110 of the magnet 102 is then further away from the second sensor element 122 than in the standby position of the switch device 100 shown in FIG. 3. The north pole section 108 of the magnet 102 is then closer to the first sensor element 120 than in the standby position of the switch device 100 shown in FIG. 3. With the further tilting movement 500, a further shifting of the magnetic field 112 caused by the magnet 102 occurs, in the direction opposite the shift shown in FIG. 4. Accordingly, in detecting the further tilting movement 500, the first sensor 120 acquires a plurality of further first magnetic field values, changing in the opposite direction to the first magnetic field values. The second sensor 122 acquires a plurality of further magnetic field values, changing in the opposite direction to the second magnetic field values.

The disk 300 shown in the exemplary embodiments of FIGS. 3 to 5 is selected only by way of example. Alternatively, another tilting device can be used, or the transmitter elements 302, 304 can be coupled directly to the magnet 102. The switch device 100 can also have a reset device, e.g., a spring element, in order to return the tilting magnet 102 from the positions shown in FIGS. 4 and 5 to the standby position shown in FIG. 3, without any further actuation on the part of an actuator. If the switch device is designed with a mechanical element, e.g., the snap disk described above, then the mechanical element can be used to cause a corresponding return movement into the standby position.

The illustrations in FIGS. 3 to 5 illustrate an exemplary position detection of the switch device 100 by the tilting magnet 102 presented herein, which is designed in the exemplary embodiment as a rotatably supported bar magnet. The tilting magnet 102 is actuated by the two transmitter elements 302, 304 such that it is rotated in a first direction by the first transmitter element 302, in order to execute the tilting movement 116, and is rotated in a second direction by the second transmitter element 304, in order to execute the further tilting movement 500. In the standby position shown in FIG. 3, the bar magnet 102 is disposed such that it is horizontal to a printed circuit board (not shown) supporting the sensors 120, 122. The first magnetic sensor 120 is disposed in relation to the north pole 108 of the magnet 102, and the second magnetic sensor 122 is disposed in relation to its south pole 110. When the first transmitter element 302 is actuated, the magnetic field 112 of both magnetic sensors 120, 122 is affected, and when the second transmitter element 304 is actuated, the magnetic field 112 of both sensors 120, 122 is affected in the opposite direction, respectively.

The detection of the actuation of the transmitter elements 302, 304 of the transmitter unit is detected through a change in the magnetic field direction of both magnetic sensors 120, 122, such that the effects of external fields can be detected, or deducted therefrom, respectively. Analog Hall sensors are used primarily for the magnetic sensors 120, 122. The use of a "double-die" 3D sensor is also conceivable, wherein in this case, an external field effect is not necessarily detected under all conditions.

As has already been explained in reference to FIG. 2, the concept presented herein can also be used in accordance with exemplary embodiments for acquiring the position of a defined switching point, or switch point, in addition to the position detection, which is coupled with a mechanical clicking sound, for example. The mechanical clicking sound can be generated, for example, with a snap disk. The point in time at which the snap disk is at its maximum tension, for example, can be detected on the basis of the procedure speed—because at this point, there is a speed of practically zero—and when the snap disk snaps, for example—because at this point, the speed is very high. The switching point can be placed, for example, precisely at this transition, wherein a mechanical switch is simulated via the haptic and the clicking sound.

Figure 6:
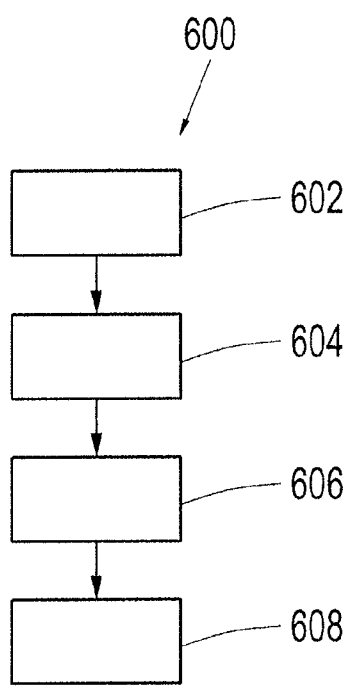
FIG. 6 shows a flow chart for a method for detecting an actuation of a switch device, in accordance with an exemplary embodiment of the present invention.

FIG. 6 shows a flow chart of an exemplary embodiment of a method 600 for detecting an actuation of a switch device. The method 600 can be executed in order to detect an actuation of an exemplary embodiment of the switch device described above.

In a step 602, an actuation signal is provided, for indicating a switch actuation when a magnetic field value of a plurality of first magnetic field values acquired by a first sensor of the switch device corresponds to a predefined first actuation value, and a magnetic field value of the plurality of second magnetic field values acquired by a second sensor of the switch device corresponds to a predefined second actuation value. In a step 604, a curve of the first magnetic field values and a curve of the second magnetic field values, or a curve of a rate of change of the first magnetic field values and a curve of a rate of change of the second magnetic field values are determined. When the curves of the magnetic field values, or the curves of the rates of change have a predefined characteristic, a first current magnetic field value of the plurality of first magnetic field values, and a second current magnetic field value of the plurality of second magnetic field values are acquired in step 606. Based on the current magnetic field value acquisition, the predefined first actuation value is modified to the first current magnetic field value, and the predefined second actuation value is modified to the second current magnetic field value in step 608.

The exemplary embodiments described herein and shown in the figures are selected merely by way of example. Different exemplary embodiments can be combined with one another, either in their entirety or with respect to individual features. Moreover, one exemplary embodiment can be supplemented with features of another exemplary embodiment. Furthermore, method steps according to the invention can be repeated, and also executed in a sequence different from that described herein.

If an exemplary embodiment comprises an "and/or" conjunction between a first feature and a second feature, then this can be read to mean that the exemplary embodiment according to one embodiment comprises both the first feature and the second feature, and according to another embodiment, comprises either just the first feature or just the second feature.

REFERENCE SYMBOLS

100 Switch device
102 magnet
104 transmitter device
106 sensor device
108 north pole section of the magnet
110 south pole section of the magnet
112 magnetic field
114 axle
116 tilting movement
118 printed circuit board
120 first sensor element
122 second sensor element
124 axis of symmetry
126 first magnetic field value
128 second magnetic field value
130 evaluation device
132 actuation signal
134 mechanical element
200 curve of the first magnetic field values
202 first current magnetic field value
204 curve of the second magnetic field values
206 second current magnetic field value
208 first magnetic field value interval
210 second magnetic field value interval
300 disk
302 first transmitter element
304 second transmitter element
306 first position on the disk
308 first actuation element
310 second position on the disk
312 second actuation element
500 further tilting movement
600 method for detecting an actuation of a switch device
602 step for the provision of an actuation signal
604 step for the determination of a curve of rates of change
606 step for acquiring a first and second current magnetic field value
608 step for modifying the predetermined actuation value to the current magnetic field value

What is claimed is:

1. A switch device, the switch device comprising:
a magnet supported by a disk and an axle passing through the disk to support the magnet such that the magnet can tilt;
a transmitter device coupled to the magnet and comprising a first transmitter element and a second transmitter element, wherein the first transmitter element is coupled to the disk at a first position and is designed to cause a first tilting movement of the magnet in response to a first switch actuation of the switch device, and wherein the second transmitter element is coupled to the disk at a second position and is designed to cause a second tilting movement of the magnet, counter to the first tilting movement, in response to a second switch actuation of the switch device; and a sensor device having a first sensor element and a second sensor element for detecting the first and second tilting movements;

wherein the first sensor element is designed to acquire a plurality of first magnetic field values of a first magnetic field shift of a magnetic field generated by the magnet caused by the first tilting movement;

wherein the first sensor element is also designed to acquire a plurality of further first magnetic field values of a further first magnetic field shift of the magnetic field generated by the magnet caused by the second tilting movement;

wherein the second sensor element is designed to acquire a plurality of second magnetic field values of a second magnetic field shift of the magnetic field generated by the magnet caused by the first tilting movement; and wherein the second sensor element is also designed to acquire a plurality of further second magnetic field values of a further second magnetic field shift of the magnetic field generated by the magnet caused by the second tilting movement.

2. The switch device of claim 1, wherein the first sensor element is positioned to correspond with a magnetic north pole section of the magnet and the second sensor element is positioned to correspond with a magnetic south pole section of the magnet.

3. The switch device of claim 1, wherein the switch device further comprises an evaluation device coupled to the sensor device, which is designed to provide an actuation signal to indicate the first switch actuation when one of the plurality of first magnetic field values corresponds to a predetermined first actuation value and/or one of the plurality of second magnetic field values corresponds to a predetermined second actuation value.

4. The switch device of claim 3, wherein the switch device further comprises a mechanical element, which is designed to indicate, haptically and/or acoustically, a switch actuation of the transmitter device sufficient for providing the actuation signal.

5. The switch device of claim 4, wherein the mechanical element comprises at least one snap disk.

6. The switch device of claim 3, wherein the evaluation device determines a curve of the first magnetic field values based on the plurality of first magnetic field values, acquires a first current magnetic field value of the plurality of first magnetic field values when the curve has a predetermined characteristic, and modifies the predetermined first actuation value to the first current magnetic field value and/or determines a curve of the second magnetic field values based on the plurality of second magnetic field values, acquires a second current magnetic field value of the plurality of second magnetic field values when the curve has a predetermined characteristic, and modifies the predetermined second actuation value to the second current magnetic field value.

7. The switch device of claim 3, wherein the evaluation device is furthermore designed to modify the predetermined first actuation value to the first current magnetic field value when the first current magnetic field value lies within a predetermined first magnetic field value interval, and to modify the predetermined second actuation value to the second current magnetic field value when the second current magnetic field value lies within a predetermined second magnetic field value interval.

8. A method for detecting an actuation of a switch device, the method comprising:

presenting a magnet supported by a disk and an axle passing through the disk to support the magnet such that the magnet can tilt, a transmitter device coupled to the magnet and comprising a first transmitter element and a second transmitter element, wherein the first transmitter element is coupled to the disk at a first position and is designed to cause a first tilting movement of the magnet in response to a first switch actuation of the switch device, wherein the second transmitter element is coupled to the disk at a second position, and a sensor device, comprising a first sensor element and a second sensor element for detecting the first tilting movement, wherein the first sensor element is designed to acquire a plurality of first magnetic field values of a first magnetic field shift of a magnetic field generated by the magnet caused by the first tilting movement, and the second sensor element is designed to acquire a plurality of second magnetic field values of a second magnetic field shift of the magnetic field generated by the magnet caused by the first tilting movement;

presenting an actuation signal to indicate the first switch actuation when one of the plurality of first magnetic field values corresponds to a predetermined first actuation value, and one of the plurality of second magnetic field values corresponds to a predetermined second actuation value;

causing the first titling movement of the magnet via the first transmitter element;

causing a second tilting movement of the magnet that is counter to the first tilting movement via the second transmitter element in response to a second switch actuation of the switch device; and detecting the second tilting movement via the first and second sensor elements by the first sensor element acquiring a plurality of further first magnetic field values of a further first magnetic field shift of the magnetic field generated by the magnet caused by the second tilting movement and the second sensor element acquiring a plurality of further second magnetic field values of a further second magnetic field shift of the magnetic field generated by the magnet caused by the second tilting movement.

9. The method of claim 8, the method further comprising determining a curve of the first magnetic field values and a curve of the second magnetic field values;

acquiring a first current magnetic field value of the plurality of first magnetic field values when the curve of the first magnetic field values has a predetermined characteristic, and a second current magnetic field value of the plurality of second magnetic field values when the curve of the second magnetic field values has a predetermined characteristic; and modifying the predetermined first actuation value to the first current magnetic field value and the predetermined second actuation value to the second current magnetic field value.

10. A computer program product having programming code that is executed on a switch device for detecting an actuation of a switch device, the computer program product comprising:

a magnet supported by a disk and an axle passing through to disk to support the magnet such that the magnet can tilt;

a transmitter device coupled to the magnet and comprising a first transmitter element and a second transmitter element, wherein the first transmitter element is coupled to the disk at a first position and is designed to cause a first tilting movement of the magnet in response to a first switch actuation of the switch device, and wherein the second transmitter element is coupled to the disk at a second position and is design to cause a second tilting movement of the magnet, counter to the first tilting movement, in response to a second switch actuation of the switch device;

a sensor device comprising a first sensor element and a second sensor element for detecting the first tilting movement, the first sensor element designed to acquire a plurality of first magnetic field values of a first magnetic field shift of a magnetic field generated by the magnet caused by the first tilting movement, and the second sensor element designed to acquire a plurality of second magnetic field values of a second magnetic field shift of the magnetic field generated by the magnet caused by the first tilting movement;

an actuation signal to indicate the switch actuation when one of the plurality of first magnetic field values corresponds to a predetermined first actuation value, and one of the plurality of second magnetic field values corresponds to a predetermined second actuation value;

wherein the sensor device also detects the second tilting movement by the first sensor element also being designed to acquire a plurality of further first magnetic field values of a further first magnetic field shift of the magnetic field generated by the magnet caused by the second tilting movement, and the second sensor element also being designed to acquire a plurality of further second magnetic field values of a further second magnetic field shift of the magnetic field generated by the magnet caused by the second tilting movement.

11. The switch device of claim 2, wherein the switch device further comprises an evaluation device coupled to the sensor device, which is designed to provide an actuation signal to indicate the first switch actuation when one of the plurality of first magnetic field values corresponds to a predetermined first actuation value and/or one of the plurality of second magnetic field values corresponds to a predetermined second actuation value.

12. The switch device of claim 11, wherein the switch device further comprises a mechanical element, which is designed to indicate, haptically and/or acoustically, a switch actuation of the transmitter device sufficient for providing the actuation signal.

13. The switch device of claim 12, wherein the mechanical element comprises at least one snap disk.

14. The switch device of claim 4, wherein the evaluation device determines a curve of the first magnetic field values based on the plurality of first magnetic field values, acquires a first current magnetic field value of the plurality of first magnetic field values when the curve has a predetermined characteristic, and modifies the predetermined first actuation value to the first current magnetic field value and/or determines a curve of the second magnetic field values based on the plurality of second magnetic field values, acquires a second current magnetic field value of the plurality of second magnetic field values when the curve has a predetermined characteristic, and modifies the predetermined second actuation value to the second current magnetic field value.

15. The switch device of claim 5, wherein the evaluation device determines a curve of the first magnetic field values based on the plurality of first magnetic field values, acquires a first current magnetic field value of the plurality of first magnetic field values when the curve has a predetermined characteristic, and modifies the predetermined first actuation value to the first current magnetic field value and/or determines a curve of the second magnetic field values based on the plurality of second magnetic field values, acquires a second current magnetic field value of the plurality of second magnetic field values when the curve has a predetermined characteristic, and modifies the predetermined second actuation value to the second current magnetic field value.

16. The switch device of claim 4, wherein the evaluation device is furthermore designed to modify the predetermined first actuation value to the first current magnetic field value when the first current magnetic field value lies within a predetermined first magnetic field value interval, and to modify the predetermined second actuation value to the second current magnetic field value when the second current magnetic field value lies within a predetermined second magnetic field value interval.

* * * * *